United States Patent
Anderson et al.

(10) Patent No.: US 7,725,789 B2
(45) Date of Patent: *May 25, 2010

(54) APPARATUS FOR EFFICIENTLY LOADING SCAN AND NON-SCAN MEMORY ELEMENTS

(75) Inventors: Richard Clair Anderson, Liberty Hill, TX (US); Johannes Koesters, Weil im Schoenbuch (DE); Steven Leonard Roberts, Ceder Park, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 12/187,481

(22) Filed: Aug. 7, 2008

(65) Prior Publication Data

US 2008/0307278 A1    Dec. 11, 2008

Related U.S. Application Data

(63) Continuation of application No. 10/636,984, filed on Aug. 7, 2003, now Pat. No. 7,447,960.

(51) Int. Cl.
*G01R 31/3177* (2006.01)
*G01R 31/316* (2006.01)

(52) U.S. Cl. ...................... 714/726; 714/724

(58) Field of Classification Search ............. None
See application file for complete search history.

(56) References Cited

U.S. PATENT DOCUMENTS

| | | | |
|---|---|---|---|
| 5,329,471 A | 7/1994 | Swoboda et al. | 703/23 |
| 6,510,534 B1 | 1/2003 | Nadeau-Dostie et al. | 714/724 |
| 7,447,960 B2 * | 11/2008 | Anderson et al. | 714/726 |
| 2003/0115522 A1 | 6/2003 | Nadeau-Dostie et al. | 714/726 |
| 2003/0177428 A1 | 9/2003 | Wakabayashi et al. | 714/741 |
| 2003/0188278 A1 | 10/2003 | Carrie | 716/4 |

* cited by examiner

*Primary Examiner*—Kevin L Ellis
*Assistant Examiner*—Dipakkumar Gandhi
(74) *Attorney, Agent, or Firm*—Matthew B. Talpis

(57) ABSTRACT

The present invention provides a method and apparatus for efficiently loading values into scan and non-scan memory elements. First, the network used to distribute control signals to the memory elements is cleared. Second, the desired values are loaded into the scan memory elements. Third, the values from the scan memory elements are propagated to the non-scan memory elements.

8 Claims, 1 Drawing Sheet

APPARATUS FOR EFFICIENTLY LOADING SCAN AND NON-SCAN MEMORY ELEMENTS

CROSS-REFERENCE TO RELATED APPLICATIONS

This application is a continuation of, and claims the benefit of the filing date of, U.S. patent application Ser. No. 10/636,984 entitled METHOD OF EFFICIENTLY LOADING SCAN AND NON-SCAN MEMORY ELEMENTS, filed Aug. 7, 2003 now U.S. Pat. No. 7,447,960.

BACKGROUND OF THE INVENTION

1. Field of the Invention

The invention relates generally to logic circuits and, more particularly, to logic circuits with mixed scan and non-scan memory elements.

2. Description of the Related Art

One purpose of a logic circuit simulator is to allow for verification of a logic circuit's functions so that errors in the logic circuit design can be found and addressed prior to manufacturing. Verification in this context refers to the entire process of testing, debugging, and verifying that the logic circuit behaves as intended.

For verification purposes, it is often desirable to be able to examine the contents of memory elements. For this purpose, memory elements may be connected sequentially, to keep the number of wires manageable, using a separate set of connections known as the scan path. Scan control signals are sent to the memory elements to toggle the input of the memory elements between the scan path and the function path, which is used during the normal operation of the device. During verification for example, the circuit clock can be temporarily suspended, and scan memory elements toggled from the function path to the scan path, allowing the values of the scan memory elements to be scanned out to a host device for analysis.

In prior art logic circuits all memory elements were scanned. However, the number of memory elements in modern designs often outnumber the amount of manageable wires, so newer logic circuits use a mix of scan and non-scan memory elements.

It is desirable for all memory elements to be loaded with specific values during events such as a power on reset (POR) so that a known state for the logic circuit is achieved. Typically, for logic circuits with a mix of scan and non-scan memory elements, only the scan memory elements are loaded with specific values. Thus the logic circuit is not in a known state because the values of the non-scan memory elements are unknown.

Therefore, there is a need for efficiently loading a specific set of values into both the scan memory elements and non-scan memory elements of a logic circuit simulator.

SUMMARY OF THE INVENTION

The present invention provides a method and apparatus for efficiently loading values into scan and non-scan memory elements. First, the network used to distribute control signals to the memory elements is cleared. Second, the desired values are loaded into the scan memory elements. Third, the values from the scan memory elements are propagated to the non-scan memory elements.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, it will be apparent to those skilled in the art that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered to be within the understanding of persons of ordinary skill in the relevant art.

In the remainder of this description, a processing unit (PU) may be a sole processor of computations in a device. In such a situation, the PU is typically referred to as an MPU (main processing unit). The processing unit may also be one of many processing units that share the computational load according to some methodology or algorithm developed for a given computational device. For the remainder of this description, all references to processors shall use the term MPU whether the MPU is the sole computational element in the device or whether the MPU is sharing the computational element with other MPUs.

It is further noted that, unless indicated otherwise, all functions described herein may be performed in either hardware or software, or some combination thereof In a preferred embodiment, however, the functions are performed by a processor such as a computer or an electronic data processor in accordance with code such as computer program code, software, and/or integrated circuits that are coded to perform such functions, unless indicated otherwise.

A logic circuit simulator may be used to verify the behavior of a logic circuit so that errors in the logic circuit design can be found and addressed prior to manufacturing. Verification in this context refers to the entire process of testing, debugging, and verifying that the logic circuit functions as intended.

Figure 1:
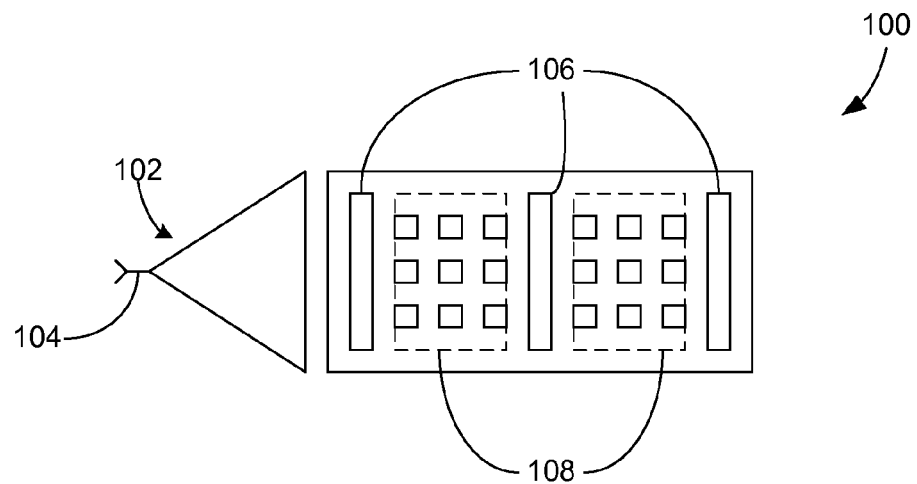
FIG. 1 is a block diagram showing relevant portions of the logic circuit simulation.

Referring to FIG. 1 of the drawings, the reference numeral 100 generally designates a block diagram showing relevant portions of a logic circuit simulator, comprising a fanout network 102, a control signal input 104, scan memory elements 106 and non-scan memory elements 108. Note that in FIG. 1, non-scan memory elements 108 are shown to comprise three rows of six non-scan memory elements. The number of scan and non-scan memory elements shown is purely for the purpose of illustration.

Fanout network 102 is coupled to scan memory elements 106 and to non-scan memory elements 108. Fanout network 102 receives a control signal at input 104, and distributes the control signal to scan memory elements 106 and non-scan memory elements 108.

Fanout network 102 is comprised of a network of transistors that starts with one transistor that feeds two transistors, each of which in turn feed two more transistors and so on, so that a control signal applied to a single transistor at input 104 can be distributed via fanout network 102 to reach scan memory elements 106 and non-scan memory elements 108. The number of scan memory elements 106 and non-scan memory elements 108 typically determines the depth of fanout network 102. Control signals that are distributed in this manner are sometimes referred to as pervasive control signals.

It may be desirable under certain situations to be able to load the logic circuit's scan memory elements 106 and non-scan memory elements 108 with known values. For example, during a power on reset (POR), it is desirable to be able to initialize scan memory elements 106 and non-scan memory elements 108 by loading them with specific values to create a known, initial state. In one specific embodiment, latches may be used as memory elements, and may have a value of 0 or 1.

During verification, it is advantageous to be able to apply a set of values to the inputs of the logic circuit and examine the contents of scan memory elements 106 to verify that the logic circuit is functioning the way it was designed to. One way of achieving this is to connect scan memory elements 106 sequentially, to keep the number of wires manageable, using a separate scan path. Scan control signals may then be applied to fanout network 102 to toggle the input of scan memory elements 106 between the scan path and the function path, which is used during the normal operation of the device.

For example, during verification, the circuit clock can be temporarily suspended, and scan memory elements 106 toggled from the function path to the scan path, allowing the values of scan memory elements 106 to be extracted and stored in a host device. Once extracted, the values obtained from scan memory elements 106 may be analyzed to verify the logic of the circuit. The extracted values may also be stored in the simulator and used to load scan memory elements 106 when an event such as a power on reset occurs.

Figure 2:
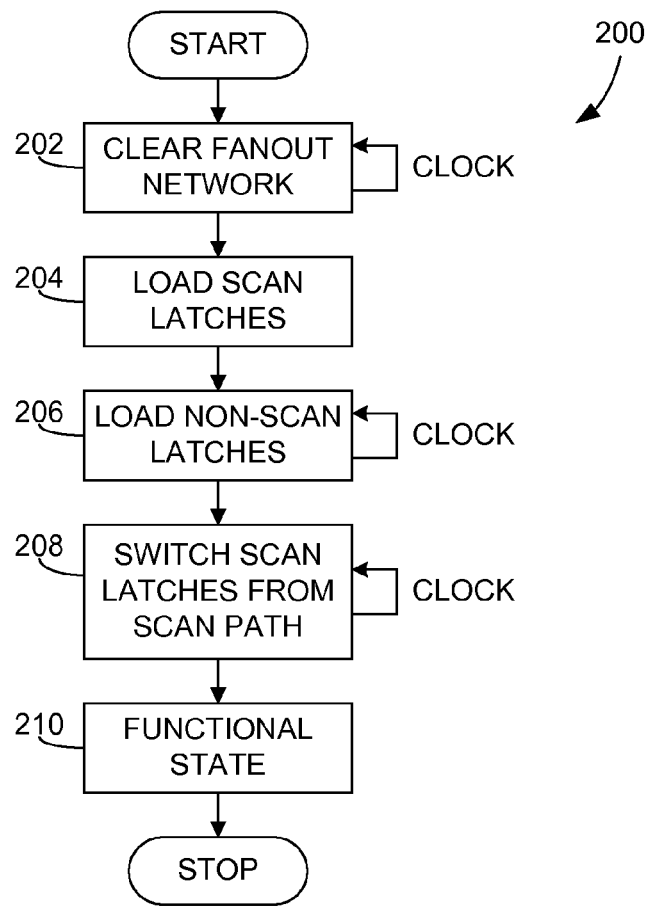
FIG. 2 is a flow diagram illustrating an algorithm for loading scan and non-scan memory elements.

Now referring to FIG. 2, the reference numeral 200 generally designates a flow diagram illustrating an algorithm for loading scan and non-scan memory elements.

In step 202, fanout network 102 is cleared by clocking zeros as many cycles as is necessary to propagate the zeros throughout fanout network 102. The number of cycles required is dependent upon the depth of the fanout network.

In step 204, scan memory elements 106 are loaded with known values. Typically, this is initiated by an event such as a power on reset. In a logic circuit simulator, this step is usually done in one cycle. At this point, scan memory elements 106 are loaded with known values, but non-scan memory elements 108 have unknown values.

In step 206, scan memory elements 106 are held fixed and the clock is started so that non-scan memory elements 108 inherit the value of their associated scan memory elements 106. The number of cycles the clock is run is dependent upon on the number of non-scan memory elements 108 associated with each scan memory element 106. In one embodiment, scan memory elements 106 may be held fixed using a force control enable (FCE) signal. In one embodiment, there may be three non-scan memory elements 108 for every scan memory element 106. At the conclusion of this step, scan memory elements 106 and non-scan memory elements 108 will have been loaded with known values.

In step 208, the scan memory elements 106 are switched from the scan path to the function path. In one embodiment, this may be done applying a THOLD control signal to input 104 of fanout network 102. The number of cycles required is equal to the depth of fanout network 102.

Finally, in step 210, once all scan memory elements 106 have changed over to the function path, so that function values can propagate, the logic circuit is in a functional state, ready for functional testing.

The algorithm disclosed in the present invention is a linear function of the depth of fanout network 102 and of the depth of the path connecting non-scan memory elements. It is well known in the art that a linear algorithm is significantly more efficient than an exponential algorithm. The topographical information for a logic circuit design, which comprises information on the latches, gates, and wires in the logic circuit, is called a netlist. The algorithm disclosed in the present invention may be used on netlists in which pervasive control of the memory elements is achieved by a variety of methods, including clock gating and data path mixing.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

The invention claimed is:

1. An apparatus for efficiently loading scan and non-scan memory elements in a logic circuit simulator, the apparatus comprising:
    a clearing processing unit for clearing a signal distribution network coupled to the scan and non-scan memory elements by clocking zeros and propagating the zeros in the signal distribution network wherein the propagating of the zeros is dependent on the depth of the signal distribution network and wherein the signal distribution network further comprises a control signal input;
    a loading processing unit for loading a previously determined set of values into each of the scan memory elements wherein the loading is initiated with a power on reset event and wherein the previously determined set of values are obtained by extracting them from the scan memory elements of the logic circuit simulator; and
    a propagating processing unit for propagating the values from the scan memory elements to the non-scan memory elements wherein a circuit clock is temporarily suspended and the scan memory elements are toggled from a function path to a scan path and wherein the values are further extracted from the scan memory elements and analyzed and stored on a host device.

2. The apparatus of claim 1 wherein the scan and non-scan memory elements are latches.

3. The apparatus of claim 1 wherein the previously determined set of values is obtained by extracting them from the scan memory elements of the logic circuit simulator.

4. The apparatus of claim 1 wherein there are three non-scan memory elements associated with each scan memory element.

5. A computer program product for efficiently loading scan and non-scan memory elements in a logic circuit simulator, the computer program product having a medium with a computer program embodied thereon, the computer program comprising:
    computer program code for clearing a signal distribution network coupled to the scan and non-scan memory elements by clocking zeros and propagating the zeros in the signal distribution network wherein the propagating of the zeros is dependent on the depth of the signal distribution network and wherein the signal distribution network further comprises a control signal input;

computer program code for loading a previously determined set of values into each of the scan memory elements wherein the loading is initiated with a power on reset event and wherein the previously determined set of values are obtained by extracting them from the scan memory elements of the logic circuit simulator; and computer program code for propagating the values from the scan memory elements to the non-scan memory elements wherein a circuit clock is temporarily suspended and the scan memory elements are toggled from a function path to a scan path and wherein the values are further extracted from the scan memory elements and analyzed and stored on a host device.

6. The computer program product of claim 5 wherein the scan and non-scan memory elements are latches.

7. The computer program product of claim 5 wherein the previously determined set of values is obtained by extracting them from the scan memory elements of the logic circuit simulator.

8. The computer program product of claim 5 wherein there are three non-scan memory elements associated with each scan memory element.

* * * * *